US006794753B2

(12) United States Patent
Bell et al.

(10) Patent No.: US 6,794,753 B2
(45) Date of Patent: Sep. 21, 2004

(54) DIFFUSION BARRIER AND METHOD THEREFOR

(75) Inventors: Byron Vencent Bell, Lexington, KY (US); Yimin Guan, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 10/330,728

(22) Filed: Dec. 27, 2002

(65) Prior Publication Data

US 2004/0127021 A1 Jul. 1, 2004

(51) Int. Cl.[7] .......................... H01L 23/48; H01L 23/52; H01L 29/40
(52) U.S. Cl. .................... 257/751; 257/270; 257/763
(58) Field of Search .................... 257/270, 751, 257/763; 438/210, 382, 627, 643

(56) References Cited

U.S. PATENT DOCUMENTS

| | | |
|---|---|---|
| 4,042,479 A | 8/1977 | Yamazaki et al. |
| 4,141,020 A | 2/1979 | Howard et al. |
| 4,154,874 A | 5/1979 | Howard et al. |
| 4,201,999 A | 5/1980 | Howard et al. |
| 4,649,070 A | 3/1987 | Kondo et al. |
| 4,680,612 A | 7/1987 | Hieber et al. |
| 4,801,067 A | 1/1989 | Kondo et al. |
| 4,862,197 A | 8/1989 | Stoffel |
| 4,920,071 A | 4/1990 | Thomas |
| 4,965,611 A | 10/1990 | Pan et al. |
| 5,231,306 A | 7/1993 | Meikle et al. |
| 5,489,548 A | 2/1996 | Nishioka et al. |
| 5,504,041 A | 4/1996 | Summerfelt |
| 5,554,564 A | 9/1996 | Nishioka et al. |
| 5,636,441 A | 6/1997 | Meyer et al. |
| 5,834,846 A | 11/1998 | Shinriki et al. |
| 5,882,399 A | 3/1999 | Ngan et al. |
| 5,892,281 A | 4/1999 | Akram et al. |
| 5,939,787 A | 8/1999 | Lee |
| 5,942,799 A | 8/1999 | Danek et al. |
| 6,139,697 A | 10/2000 | Chen et al. |
| 6,207,558 B1 | 3/2001 | Singhvi et al. |
| 6,239,492 B1 | 5/2001 | Meikle et al. |
| 6,271,591 B1 * | 8/2001 | Dubin et al. ............... 257/751 |
| 6,291,885 B1 | 9/2001 | Cabral, Jr. et al. |
| 6,368,880 B2 | 4/2002 | Singhvi et al. |
| 6,383,920 B1 | 5/2002 | Wang et al. |
| 6,404,057 B1 | 6/2002 | Akram et al. |
| 2002/0121699 A1 * | 9/2002 | Cheng et al. ............... 257/758 |

FOREIGN PATENT DOCUMENTS

| | | |
|---|---|---|
| JP | 54034097 | 3/1979 |
| JP | 57141949 | 9/1982 |
| JP | 60089567 | 10/1983 |
| JP | 60089568 | 5/1985 |
| JP | 11111919 | 4/1999 |
| WO | WO 01/91181 | 11/2001 |

* cited by examiner

Primary Examiner—Long Pham
(74) Attorney, Agent, or Firm—Luedeka, Neely & Graham

(57) ABSTRACT

A semiconductor device containing at least one transistor and at least one heater resistor in a heater resistor area adjacent the at least one transistor on a semiconductor substrate. The device includes a silicon substrate containing contact openings for metal contacts to the at least one transistor. A barrier layer is in the contact openings and in the heater resistor area and provides a diffusion barrier/heater resistor layer. The barrier layer is selected from a group consisting of TaN, Ta/TaAl, TaN/TaAl, TiWN, TaAlN, TiN, $Ta(N_x, O_y)$, $WSi(N_x, O_y)$, TaSi, TaSiN, WSiN, and $TaSi(N_x, O_y)$. A conductive layer is adjacent at least a portion of the barrier layer for providing connection between a power source and the at least one heater resistor and at least one transistor. The semiconductor device is devoid of a patterned and etched barrier layer in the heater resistor area.

18 Claims, 7 Drawing Sheets

DIFFUSION BARRIER AND METHOD THEREFOR

FIELD OF THE INVENTION

The invention relates to diffusion barrier layers and methods therefor, particularly, diffusion barrier layers for microelectronic fluid ejecting devices such as used in ink jet printheads which contain aluminum metallization layers.

BACKGROUND OF THE INVENTION

In a semiconductor chip containing transistor devices, metal layers function to electrically interconnect the device's different components to one another. Such metal layers generally comprise contacts, which connect the metal layer to the transistor devices and other metal layers, and traces. Aluminum has long been a preferred material for forming the metal interconnect layers, because it is relatively inexpensive and easy to work with.

Unfortunately, aluminum interconnect layers often create problems with the devices formed in a semiconductor chip made of silicon if the device undergoes temperatures in excess of about 400° C. during manufacture of the device. For example, when the aluminum is deposited on a silicon surface the two materials tend to intermix to some degree at their interface. The solubility of silicon in aluminum increases with increasing metallization temperature and approaches about 1 weight percent at about 500° C. as shown by a aluminum silicon phase diagram in FIG. 1. At about 500° C., silicon readily diffuses into aluminum in order to satisfy its solubility requirement. The loss of silicon from the substrate leaves pits behind in the substrate. Likewise, aluminum counter-migrates into the silicon substrate during subsequent deposition or anneal processes. Since very small amounts of aluminum dissolve in silicon, the migrated aluminum fills the silicon depleted regions or pits and forms aluminum filaments. The condition wherein aluminum has migrated into the silicon is known as "spiking." Spiking can create short circuits in the device when the migrated aluminum spikes through an active region in the silicon device. The aluminum spikes can short a reverse-biased junction and cause a short or excessive leakage of the device.

In order to reduce or prevent aluminum junction spiking problems, the diffusion of silicon into aluminum and vice versa should be minimized. A diffusion barrier layer is typically used to reduce migration of silicon and aluminum into each other. However, providing a diffusion barrier significantly increases the manufacturing costs for microelectronic devices because multiple steps are often required to pattern and etch the diffusion barrier layer. Since the diffusion barrier layer is usually highly conductive, it must be etched prior to depositing a resistive layer in order to prevent shorting between other devices such as resistors deposited on the semiconductor substrate. There is a need therefore, for improved techniques and processes for reducing spiking caused by diffusion between aluminum and silicon during a semiconductor chip manufacturing process without increasing the number of processing steps required for making such chips.

SUMMARY OF THE INVENTION

With regard to the foregoing and other objects and advantages the invention provides a semiconductor device containing at least one transistor and at least one heater resistor in a heater resistor area adjacent the at least one transistor on a semiconductor substrate. The device includes a silicon substrate containing contact openings for metal contacts to the at least one transistor. A barrier layer is adjacent the contact openings and provides a diffusion barrier/heater resistor layer. The barrier layer is selected from a group consisting of TaN, Ta/TaAl, TaN/TaAl, TiWN, TaAlN, TiN, $Ta(N_x, O_y)$, $WSi(N_x, O_y)$, TaSi, TaSiN, WSiN, and $TaSi(N_x, O_y)$. A conductive layer is adjacent at least a portion of the barrier layer for providing connection between a power source and the at least one heater resistor and at least one transistor. The semiconductor device is devoid of a patterned and etched barrier layer in the heater resistor area.

In another aspect the invention provides a method for reducing spiking in a semiconductor device undergoing a process temperature in excess of about 400° C. during a process step therefor and containing at least one transistor and at least one heater resistor in a heater resistor area adjacent the transistor on a silicon semiconductor substrate. The method includes the steps of providing contact openings adjacent at least the one transistor for metal contacts to the at least one transistor. A diffusion barrier/resistive layer is deposited in the contact openings and in the heater resistor area. The barrier/resistive layer is selected from the group consisting of TaN, Ta/TaAl, TaN/TaAl, TiWN, TaAlN, TiN, $Ta(N_x, O_y)$, $WSi(N_x, O_y)$, TaSi, TaSiN, WSiN, and $TaSi(N_x, O_y)$. A conductive layer is deposited on the barrier/resistive layer to provide connection between a power source and the at least one heater resistor and at least one transistor. According to the method a step of patterning and etching a barrier layer in the heater resistor area prior to depositing a resistive layer is avoided.

An advantage of the invention is that it provides a semiconductor device such as a printhead heater chip containing one or more transistors and heater resistors having improved resistance to junction spiking without the need for separate diffusion barrier and resistive layers. For example, conventional diffusion barrier layers such as TiW cannot be used as a resistive layer because they are too conductive. Accordingly, the TiW layer is preferably removed, as by an etching step, from the heater resistor area of an ink jet heater chip. After removing the TiW layer, a separate heater resistor layer is deposited on the surface of the chip followed by a conductive layer. Because the diffusion barrier layer or composite diffusion barrier layer is selected from or includes a resistive material, according to the invention, a separate step of etching the diffusion barrier layer in a heater resistor area prior to depositing the heater resistor layer is eliminated. The invention is particularly applicable to a semiconductor device containing at least one transistor and an adjacent heater resistor, wherein the device undergoes a temperature excursion in excess of about 400° C. during a process step for manufacturing the semiconductor device.

BRIEF DESCRIPTION OF THE DRAWINGS

Further advantages of the invention will become apparent by reference to the detailed description of preferred embodiments when considered in conjunction with the drawings, wherein like reference characters designate like or similar elements throughout the several drawings as follows.

DETAILED DESCRIPTION OF THE INVENTION

Figure 1:
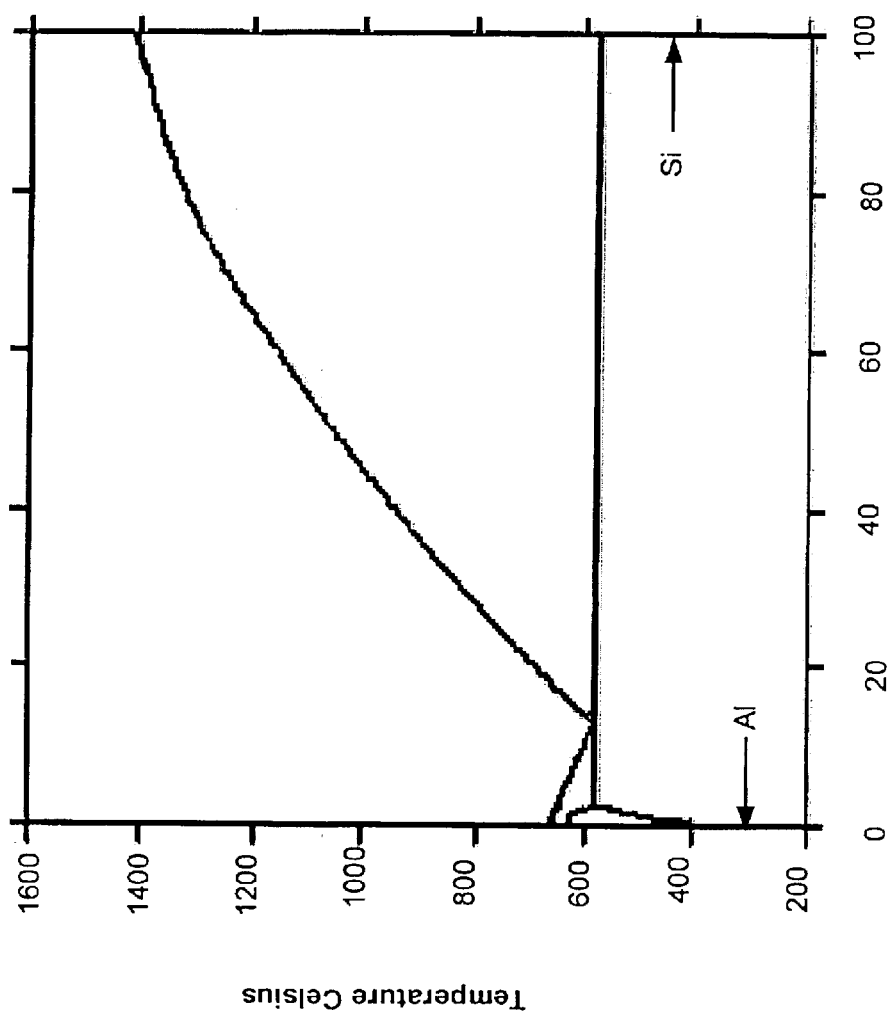
FIG. 1 is a silicon/aluminum phase diagram of silicon concentration in weight percent versus temperature in degrees Celsius.
Figure 2:
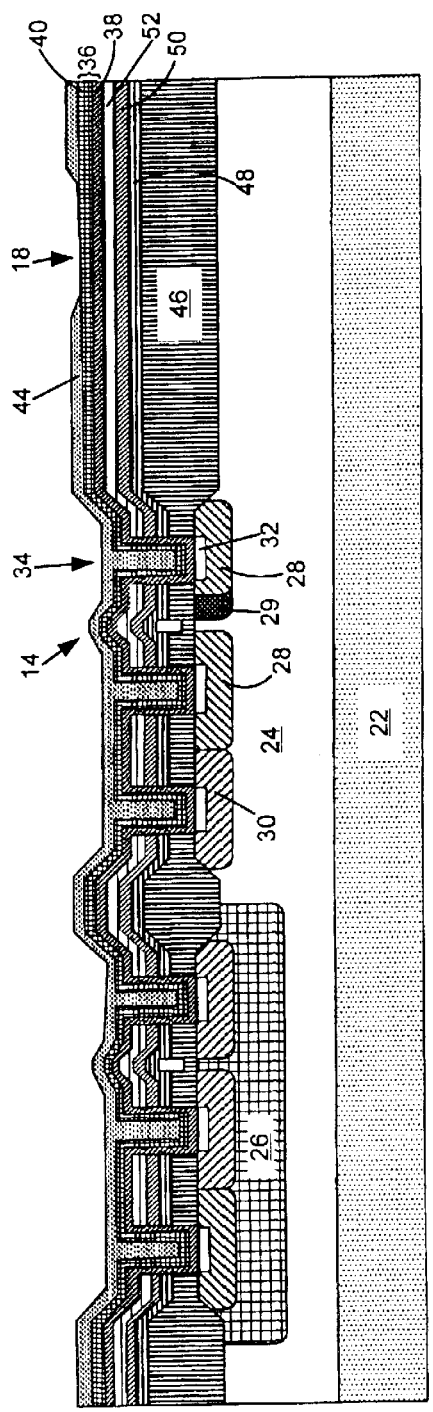
FIG. 2 is a cross-sectional view, not to scale, of a semiconductor device containing a barrier layer, at least one transistor, and at least one heater resistor according to the invention.
Figure 3:
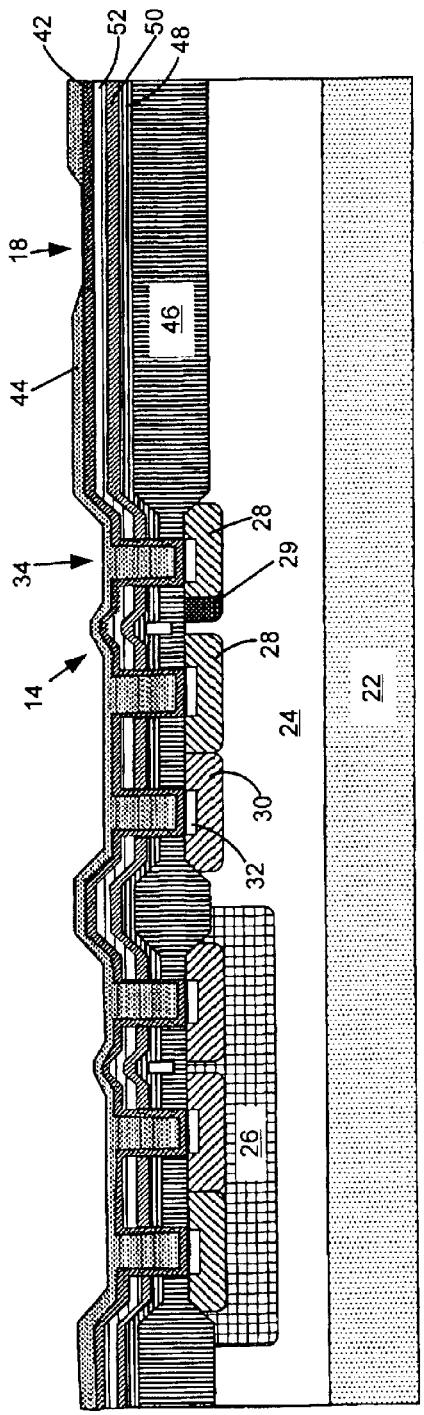
FIG. 3 is a cross-sectional view, not to scale, of a semiconductor device containing a barrier layer, at least one transistor, and at least one heater resistor according to another embodiment of the invention.

With reference to FIGS. 2 and 3, the invention provides semiconductor devices 10, 12 having at least one transistor 14 and at least one heater resistor 18 adjacent the at least one transistor 14. Each semiconductor device, such as device 10 preferably includes a substrate 22 which is preferably silicon. An epitaxial silicon layer 24 may be provided between the substrate 22 and device layers for the device 10. Area 26 of the semiconductor devices 10 is an N-doped deep well. Areas 28 and 30 are N-doped and P-doped source and drain for transistor devices such as transistor 14. Area 29 is a lightly doped drain for transistor 14. A silicide layer 32 is optionally provided in each of the contact openings 34.

In FIG. 2, a barrier layer 36 including a composite barrier/resistive layer 38/40 is provided. In FIG. 3, the barrier layer 42 is a single layer of material. Details of the barrier layers 36 and 42 are provided below. A conductive layer 44 is deposited on the resistive layer 40 (FIG. 2) or 42 (FIG. 3) and etched to provide metal interconnects in the contact openings 34 and to provide power and ground connections to the heater resistor 18. Next the barrier/resistive layer 38/40 is etched to provide individual heater resistors on the device 10. In the alternative, the barrier/resistive layer 38/40 may be etched to provide the individual heater resistors prior to depositing and etching the conductive layer 44 or at the same time the conductive layer 44 is etched. However, the barrier/resistive layer 38/40 is not removed as by etching from the heater resistor area providing heater resistors 18. The other layers in the semiconductor devices 10, 12 are conventional layers such as a thermally grown oxide layer 46, an undoped silicon oxide layer 48, a doped silicon oxide layer 50, and a phosphorus doped spin on glass layer 52. As will be described in more detail below, a separately deposited and photoetched diffusion barrier layer is not required.

Figure 4A:
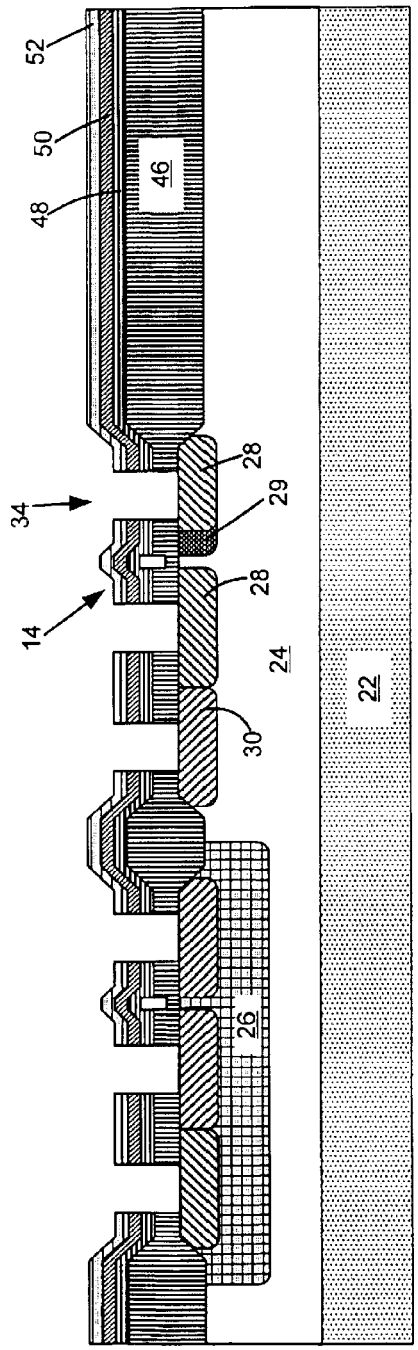
FIGS. 4A–4F are cross-sectional views, not to scale, showing steps for the manufacture of a semiconductor device containing a conventional diffusion barrier layer.
Figure 4B:
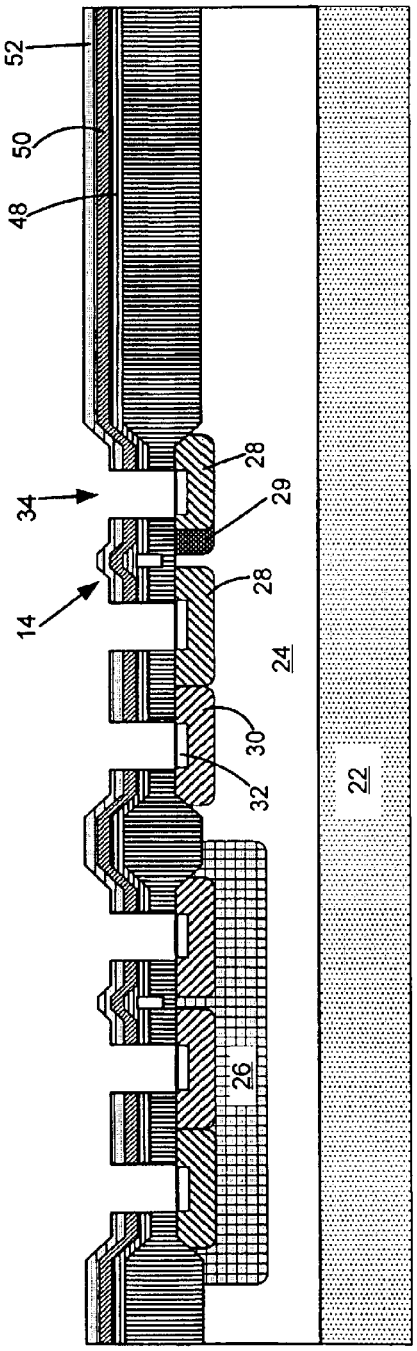

With reference to FIGS. 4A–4F, a process including a separately deposited and photoetched diffusion barrier layer is described. In the first step of the process, contact openings 34 are etched in a silicon-based semiconductor substrate 54 containing transistor devices 14 to provide interconnects for the source and drain of the transistor devices 14 using a conductive metal (FIG. 4A). The layers of materials in FIGS. 4A–4F, up to the diffusion barrier layer are the same as described with reference to FIG. 2 above. Optionally, a thin metal layer is deposited in the contact openings 34 and sintered at a high temperature, preferably in the range of from about 600° to about 700° C. to form a metal-silicide layer 32 in the contact areas 34. The thin metal layer may be selected from titanium or platinum (FIG. 4B). After forming the silicide layer 32, any unreacted metal is removed from the contact openings 34 as by use of a chemical etchant.

Figure 4C:
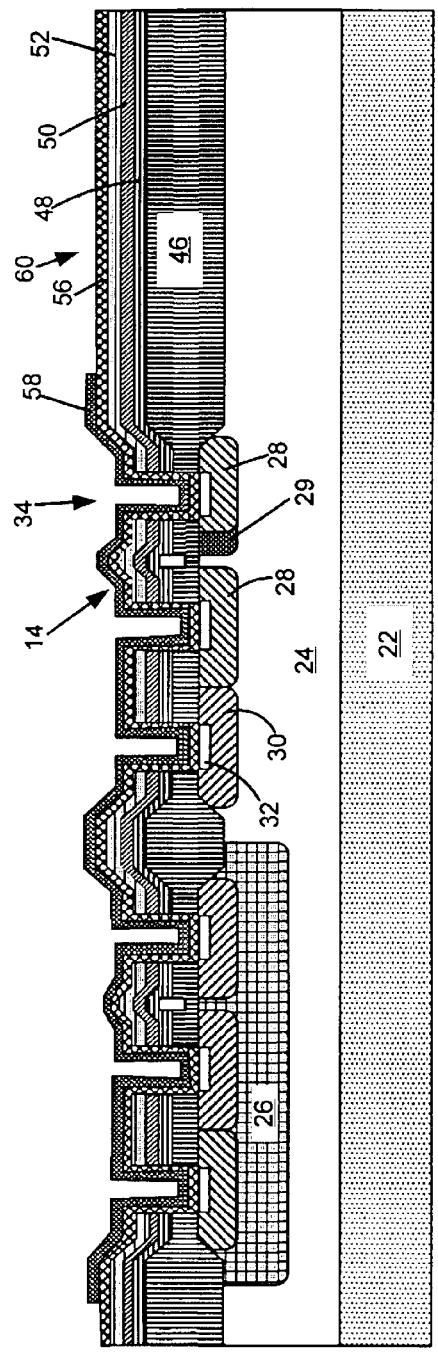
Figure 4D:
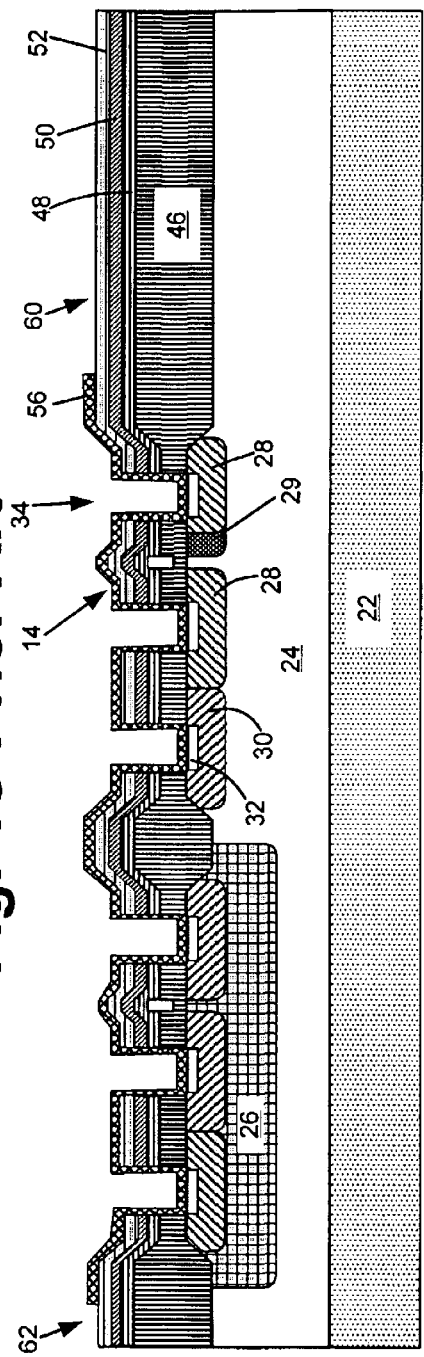

A conventional diffusion barrier material 56, such as a titanium-tungsten (TiW) alloy is deposited over the entire surface of the substrate 54 as shown in FIG. 4C. A conventional method for depositing the diffusion barrier material 56 is magnetron sputtering. A photoresist material 58 is also deposited over the entire surface of the substrate 54 and is patterned and developed to provide a photo-mask configuration shown in FIG. 4C. After patterning and etching the barrier material 56 off of portions in areas 60 and 62 of the substrate 54, the photoresist material 58 is removed as shown in FIG. 4D. Area 60 and/or area 62 provide locations for heater resistors 18, adjacent the transistors 14.

Figure 4E:
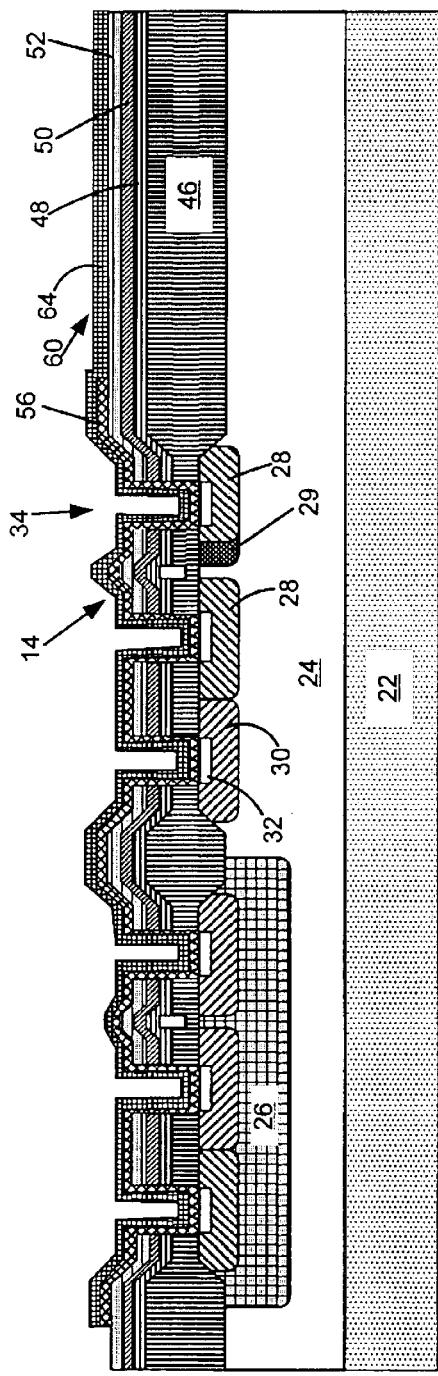
Figure 4F:
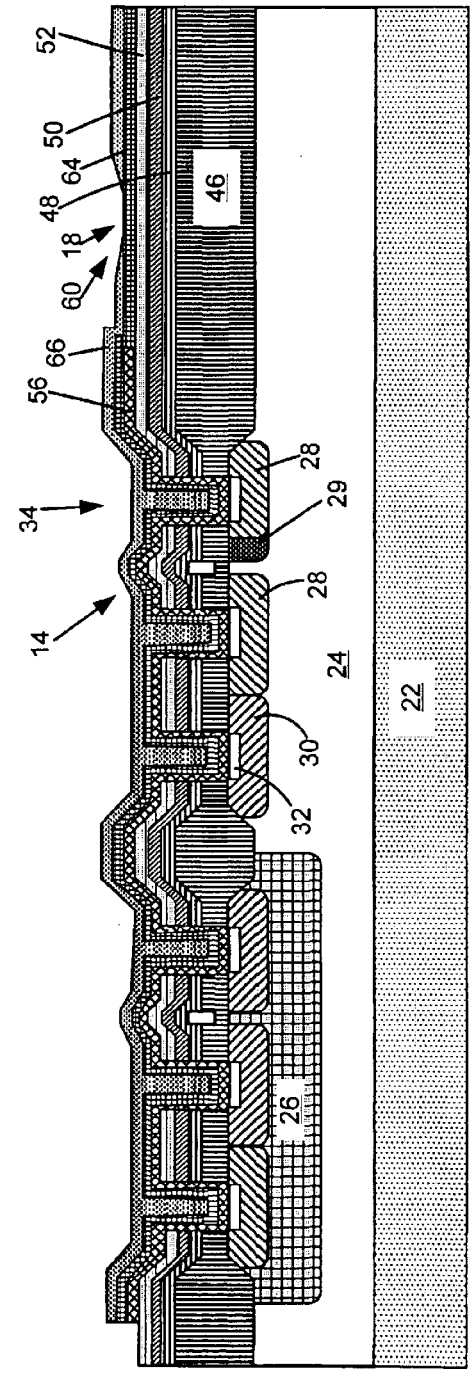

Next a resistive material is deposited over the surface of the substrate 54 to provide a resistive layer 64 (FIG. 4E). The resistive material is preferably deposited by conventional magnetron sputtering techniques. After depositing the resistive layer 64, a conductive layer 66 is deposited over the surface of the substrate and etched to provide connections to at least one heater resistor 18 in resistor area 60 as shown in FIG. 4F. Finally, the resistive layer 64 is etched to provide the individual heater resistors 18. As set forth above, the resistive layer 64 may be etched prior to depositing and etching the conductive layer 66 or at the same time the conductive layer 66 is etched to provide the individual heater resistors 18.

Figure 5A:
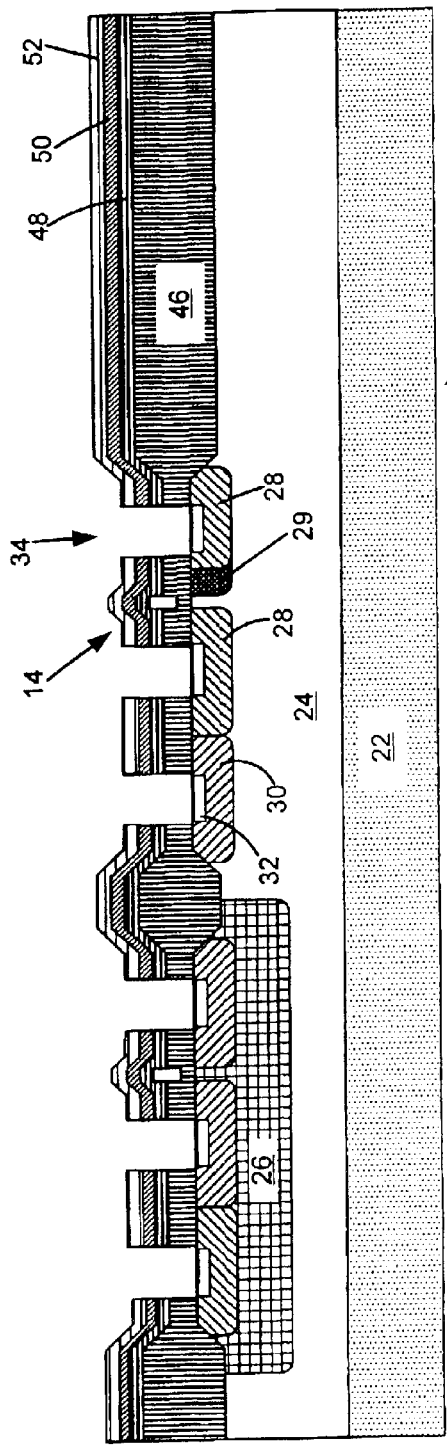
FIGS. 5A–5C are cross-sectional views, not to scale, showing steps for the manufacture of a semiconductor device containing a diffusion barrier layer according to the invention.
Figure 5B:
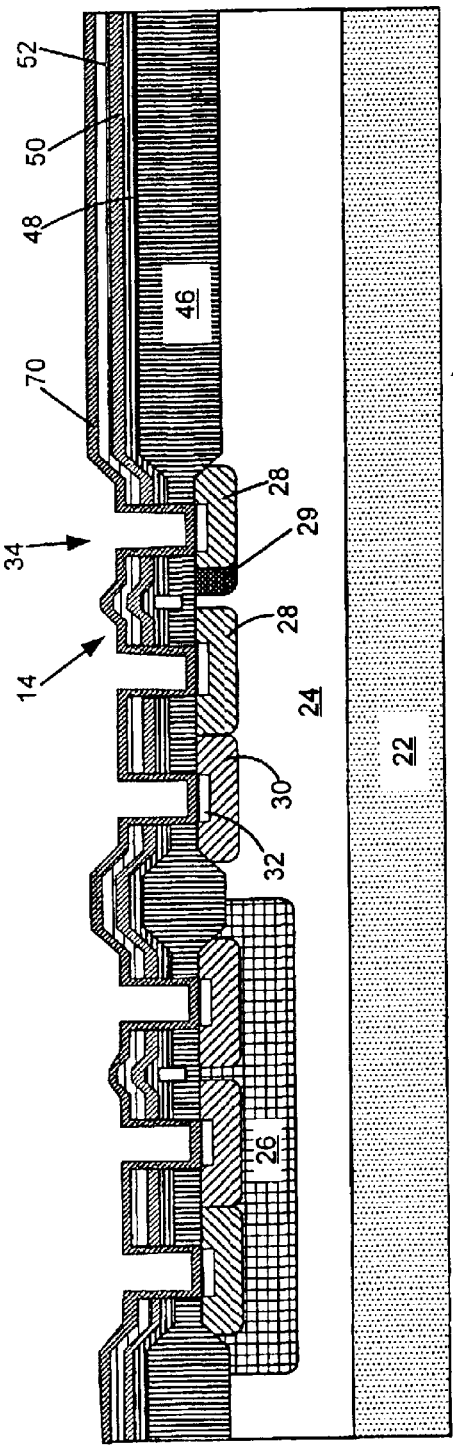
Figure 5C:
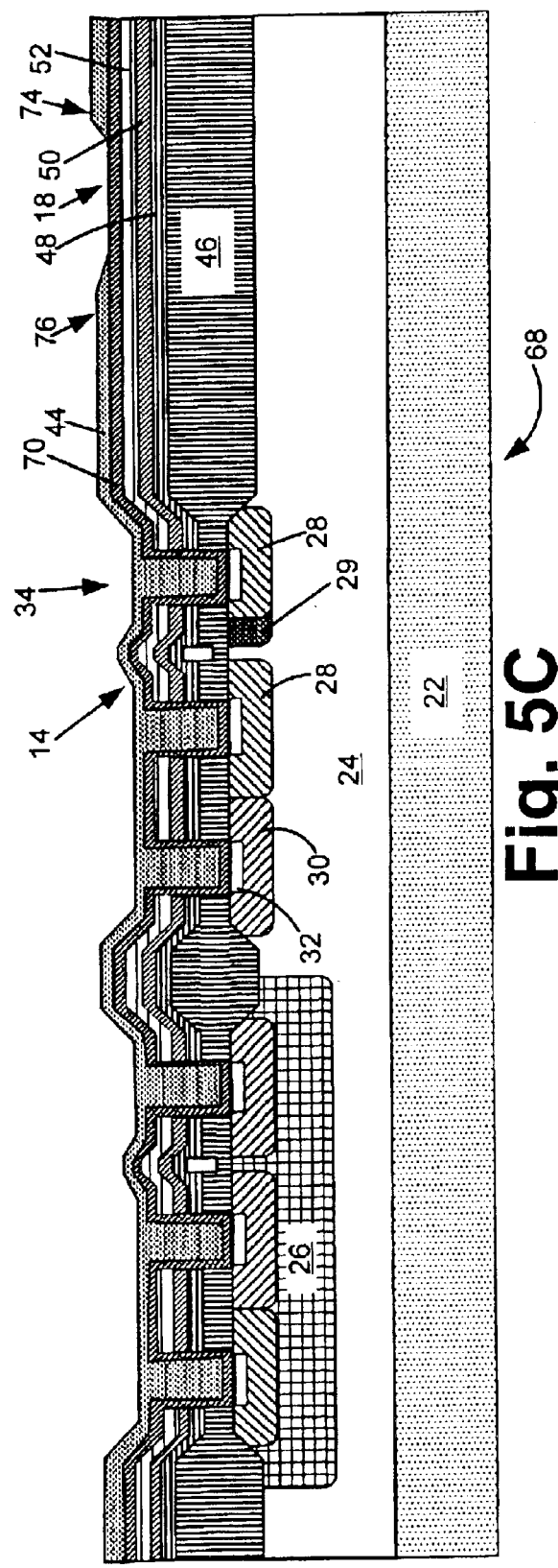

With reference to FIGS. 5A–5C, advantages of the invention will now be described. As described above with respect to FIGS. 4A and 4B, a semiconductor substrate 68 containing at least one transistor device 14 is provided. The transistor device 14 is preferably a CMOS transistor device. As before, contact openings 34 are formed in the substrate 68 and a thin metal layer is optionally deposited in the contact openings 34 and sintered to provide silicide layers 32. As before, any unreacted metal is stripped or removed from the contact openings 34 as by use of a chemical etchant The preferred material for forming the optional silicide layers 32 is selected from titanium and platinum.

Next a diffusion barrier layer 70 is deposited preferably by magnetron sputtering or reactive sputtering on the upper most layer 52 of the substrate 68 (FIG. 5B). The diffusion barrier layer 70 may be provided by a single layer selected from the group consisting of TaN, TiWN, TaAlN, TiN, Ta($N_x$, $O_y$), WSi($N_x$, $O_y$), TaSi, TaSiN, WSiN, and TaSi($N_x$, $O_y$). If tantalum (Ta) is used as the diffusion barrier layer 70, then a resistive layer 40 (FIG. 2) preferably made of TaAl is deposited over the barrier layer 70 to provide a composite barrier/resistive layer 36 (FIG. 2). The composite barrier/resistive layer Ta/TaAl is preferably deposited in sequence by magnetron sputtering. The barrier layer 70 or composite barrier layer 36 has a thickness preferably in the range of from about 800 to about 1200 Angstroms. The barrier layer 70 or composite barrier layer 36 may be etched at this step to provide individual heater resistors 18, or may be etched during or after etching a conductive layer 44 deposited on the barrier layer 70 or composite barrier layer 36.

Finally, a conductive layer 44 (FIG. 5C) is deposited on the barrier layer 70 or composite barrier resistive layer 36 by magnetron sputtering. The thickness of the conductive layer 44 preferably ranges from about 4000 to about 6000 Angstroms. The conductive layer 44 is then photoetched to provide connections to one or more heater resistors 18 by exposing the resistive layer 70 or 40 (FIG. 2) between conductors 74 and 76. The barrier layer 70 or composite layer 36 may be etched before depositing the conductive layer 44, or during or after etching the conductive layer 44 to provide individual heater resistors 18. Preferably, the barrier layer 70 or composite layer 36 is etched after depositing and etching the conductive layer 44 to provide the individual heater resistors.

Accordingly, the invention eliminates a step of depositing a photoresist layer, developing the photoresist layer and etching the barrier layer prior to depositing a resistive layer 64 (FIG. 4E) and conductive layer 44 (FIG. 4F) on the semiconductor chip 10 or 12. Elimination of at least one masking and etching step during a heater chip fabrication process significantly reduces fabrication costs, capital equipment requirements, and cycle time for producing such chips containing adjacent transistors and heater resistors.

A semiconductor device 10, 12 containing at least one transistor 14 and at least one resistor 18 made according to the invention may be used in a wide variety of applications. A preferred application for such a device 10, 12 is preferably as a heater chip in an ink jet printhead.

It is contemplated, and will be apparent to those skilled in the art from the preceding description and the accompanying drawings, that modifications and changes may be made in the embodiments of the invention. Accordingly, it is expressly intended that the foregoing description and the accompanying drawings are illustrative of preferred embodiments only, not limiting thereto, and that the true spirit and scope of the present invention be determined by reference to the appended claims.

What is claimed is:

1. A semiconductor device containing at least one transistor and at least one heater resistor in a heater resistor area adjacent the at least one transistor on a semiconductor substrate, the device comprising:

a silicon substrate containing contact openings for metal contacts to the at least one transistor;

a barrier layer in the contact openings and in the heater resistor area providing a diffusion barrier/heater resistor layer, the barrier layer being selected from a group consisting of TaN, Ta/TaAl, TaN/TaAl, TiWN, TaAlN, TiN, Ta(Nx, Oy), WSi(Nx, Oy), TaSi, TaSiN, WSiN, and TaSi(Nx, Oy); and a conductive layer adjacent at least a portion of the barrier layer for providing connection between a power source and the at least one heater resistor and at least one transistor, wherein the semiconductor device is devoid of a patterned and etched barrier layer in the heater resistor area.

2. The semiconductor device of claim 1 wherein the barrier layer comprises TaN.

3. The semiconductor device of claim 2 wherein the conductive layer comprises aluminum.

4. The semiconductor device of claim 1 wherein the barrier layer comprises a composite layer of Ta and TaAl.

5. The semiconductor device of claim 4 wherein the conductive layer comprises aluminum.

6. The semiconductor device of claim 1 further comprising a silicide layer in the contact openings between the silicon substrate and the barrier layer.

7. A printhead heater chip containing at least one transistor and at least one heater resistor in a heater resistor area adjacent the at least one transistor on a silicon semiconductor substrate, the device comprising:

contact openings for metal contacts to the at least one transistor;

a barrier layer in the contact openings and in the heater resistor area providing a diffusion barrier/heater resistor layer, the barrier layer being selected from a group consisting of TaN, Ta/TaAl, TaN/TaAl, TiWN, TaAlN, TiN, Ta(Nx, Oy), WSi(Nx, Oy), TaSi, TaSiN, WSiN, and TaSi(Nx, Oy); and a conductive layer adjacent at least a portion of the barrier layer for providing connection between a power source and the at least one heater resistor and at least one transistor, wherein the heater chip is devoid of a patterned and etched barrier layer in the heater resistor area.

8. The printhead heater chip of claim 7 wherein the barrier layer comprises TaN.

9. The printhead heater chip of claim 8 wherein the conductive layer comprises aluminum.

10. The printhead heater chip of claim 7 wherein the barrier layer comprises a composite layer of Ta and TaAl.

11. The printhead heater chip of claim 10 wherein the conductive layer comprises aluminum.

12. The printhead heater chip of claim 7 further comprising a silicide layer in the contact openings between the silicon substrate and the barrier layer.

13. An ink jet printhead including a silicon semiconductor substrate containing at least one transistor and at least one heater resistor in a heater resistor area adjacent the transistor, the printhead being made by a process comprising:

providing contact openings adjacent the at least one transistor for metal contacts to the at least one transistor;

depositing a diffusion barrier/resistive layer in the contact openings and in the heater resistor area, the barrier/resistive layer comprising a layer selected from the group consisting of TaN, Ta/TaAl, TaN/TaAl, TiWN, TaAlN, TiN, Ta(Nx, Oy) WSi(Nx, Oy), TaSi, TaSiN, WSiN, and TaSi(Nx, Oy); and depositing a conductive layer on the barrier/resistive layer to provide connection between a power source and the at least one heater resistor and at least one transistor, wherein a step of patterning and etching a barrier layer in the heater resistor area prior to depositing a resistive layer is avoided, and wherein, in use, the printhead exhibits reduced spiking potential despite the substrate undergoing a temperature in excess of about 400° C. during a process step for making the printhead.

14. The printhead of claim 13, wherein the barrier/resistive layer comprises TaN.

15. The printhead of claim 14, wherein the conductive layer comprises aluminum.

16. The printhead of claim 13, wherein the barrier/resistive layer comprises a composite of Ta and TaAl.

17. The printhead of claim 16 wherein the conductive layer comprises aluminum.

18. The printhead of claim 13 further comprising a silicidation layer in the contact openings between the substrate and the diffusion barrier/resistive layer.

* * * * *